United States Patent
Tseng (10) Patent No.: US 9,019,693 B2
(45) Date of Patent: *Apr. 28, 2015

(54) ELECTRONIC DEVICE AND PERIPHERAL ELEMENT EJECTING METHOD THEREOF

(71) Applicant: Wistron Corp., New Taipei (TW)

(72) Inventor: Tien-Chung Tseng, New Taipei (TW)

(73) Assignee: Wistron Corp., New Taipei (TW)

( * ) Notice: Subject to any disclaimer, the term of this patent is extended or adjusted under 35 U.S.C. 154(b) by 173 days.

This patent is subject to a terminal disclaimer.

(21) Appl. No.: 13/772,257

(22) Filed: Feb. 20, 2013

(65) Prior Publication Data

US 2013/0163166 A1    Jun. 27, 2013

Related U.S. Application Data

(63) Continuation of application No. 12/573,078, filed on Oct. 2, 2009, now Pat. No. 8,462,488.

(30) Foreign Application Priority Data

Mar. 5, 2009  (TW) .............................. 98107101 A (51) Int. Cl.
  *G06F 1/16*  (2006.01)
  *H02K 7/10*  (2006.01)
  *H05K 7/14*  (2006.01)

(52) U.S. Cl.
  CPC .............. *G06F 1/1616* (2013.01); *H02K 7/10* (2013.01); *H05K 7/14* (2013.01); *G06F 1/16* (2013.01); *G06F 1/1626* (2013.01); *G06F 1/1698* (2013.01); *G06F 2200/1632* (2013.01)

(58) Field of Classification Search
  USPC ............ 271/176, 3.14, 4.01, 121, 10.11, 109; 361/679.01, 679.09, 679.4, 679.21, 361/679.22, 679.23, 679.24, 679.25, 361/679.26, 679.27, 679.29, 679.55, 361/679.56, 679.43; 16/264, 57, 303, 354; 312/223.1, 228, 319.5, 196; 345/173, 345/179, 174, 168, 169, 156, 171, 196
  See application file for complete search history.

(56) References Cited

U.S. PATENT DOCUMENTS

| 6,958,733 | B1 | 10/2005 | Jung |
| 8,313,098 | B2 * | 11/2012 | Hattori et al. |
| 8,462,488 | B2 * | 6/2013 | Tseng ...................... 361/679.01 |
| 2004/0216273 | A1 * | 11/2004 | Kang et al. ...................... 16/264 |
| 2006/0044288 | A1 | 3/2006 | Nakamura et al. |
| 2006/0257196 | A1 | 11/2006 | Liu et al. |
| 2012/0223896 | A1 | 9/2012 | Tseng et al. |

* cited by examiner

*Primary Examiner* — Hung Duong (57) ABSTRACT

An electronic device capable of ejecting a peripheral element is disclosed, including a housing, a first wheel and a driving unit. The housing has a chamber, wherein the peripheral element is stored in the chamber. The first wheel is disposed in the housing, wherein the first wheel contacts the peripheral element. The driving unit is disposed in the housing, the driving unit rotates the first wheel, and the first wheel moves the peripheral element from a first position to a second position.

18 Claims, 11 Drawing Sheets

ELECTRONIC DEVICE AND PERIPHERAL ELEMENT EJECTING METHOD THEREOF

CROSS REFERENCE TO RELATED APPLICATIONS

This Application is a Continuation of pending U.S. patent application Ser. No. 12/573,078, filed Oct. 2, 2009 and entitled "Electronic device and peripheral element ejecting method thereof," which claims priority of Taiwan Patent Application No. 098107101, filed on Mar. 5, 2009, the entirety of which are incorporated by reference herein.

BACKGROUND OF THE INVENTION

1. Field of the Invention

The present invention relates to an electronic device, and in particular relates to an electronic device automatically ejecting a peripheral element.

2. Description of the Related Art

Figure 1:
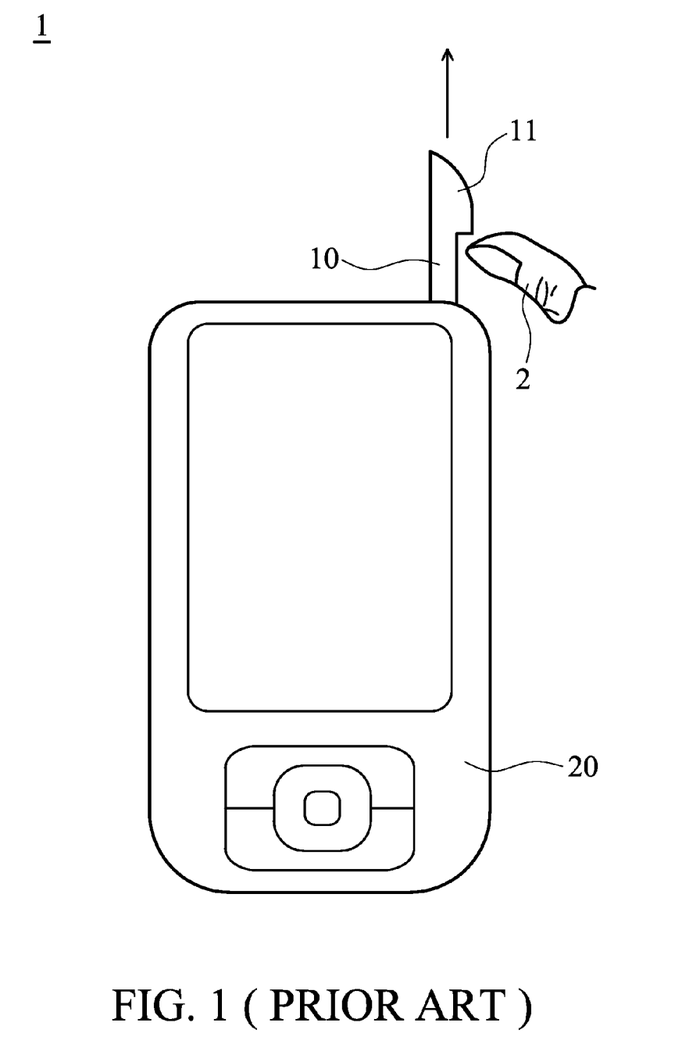
FIG. 1 shows a conventional electronic device (Personal Digital Assistant)

FIG. 1 shows a conventional electronic device (Personal Digital Assistant) 1. Conventionally, a stylus pen (peripheral element) 10 is disposed in a housing 20 of the electronic device 1. When users need to use the stylus pen 10, a user pushes a protrusion 11 of the stylus pen 10 with a finger 2 to unload the stylus pen 10 from the housing 20. However, the protrusion 11 often gets stuck in the housing 20. Thus, making it hard to push the protrusion 11.

BRIEF SUMMARY OF THE INVENTION

A detailed description is given in the following embodiments with reference to the accompanying drawings.

An electronic device capable of ejecting a peripheral element includes a housing, a first wheel and a driving unit. The housing has a chamber, wherein the peripheral element is stored in the chamber. The first wheel is disposed in the housing, wherein the first wheel contacts the peripheral element. The driving unit is disposed in the housing, the driving unit rotates the first wheel, and the first wheel moves the peripheral element from a first position to a second position The electronic device of the embodiment of the invention unloads the peripheral element automatically. Thus, the embodiment of the invention provides convenience to users, and has increased value.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2A:
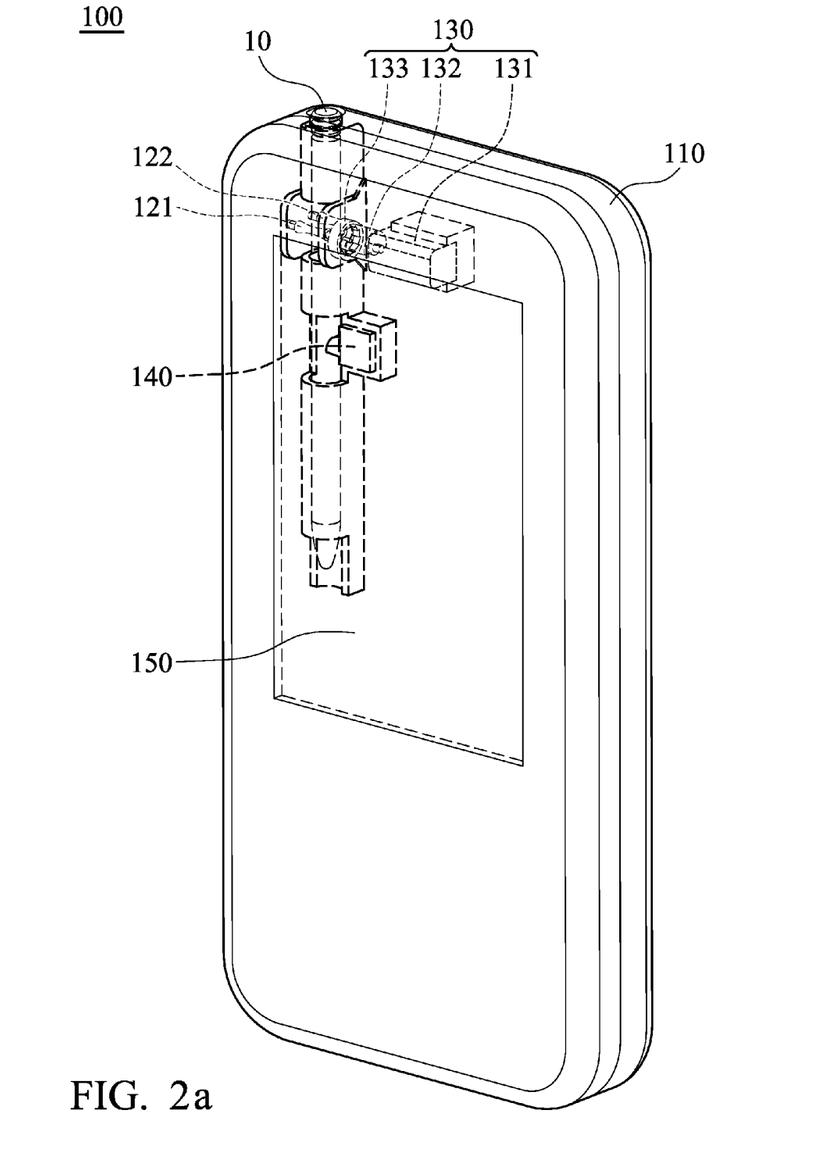
FIG. 2a shows an electronic device of an embodiment of the invention, wherein a peripheral element is in a first position.
Figure 2B:
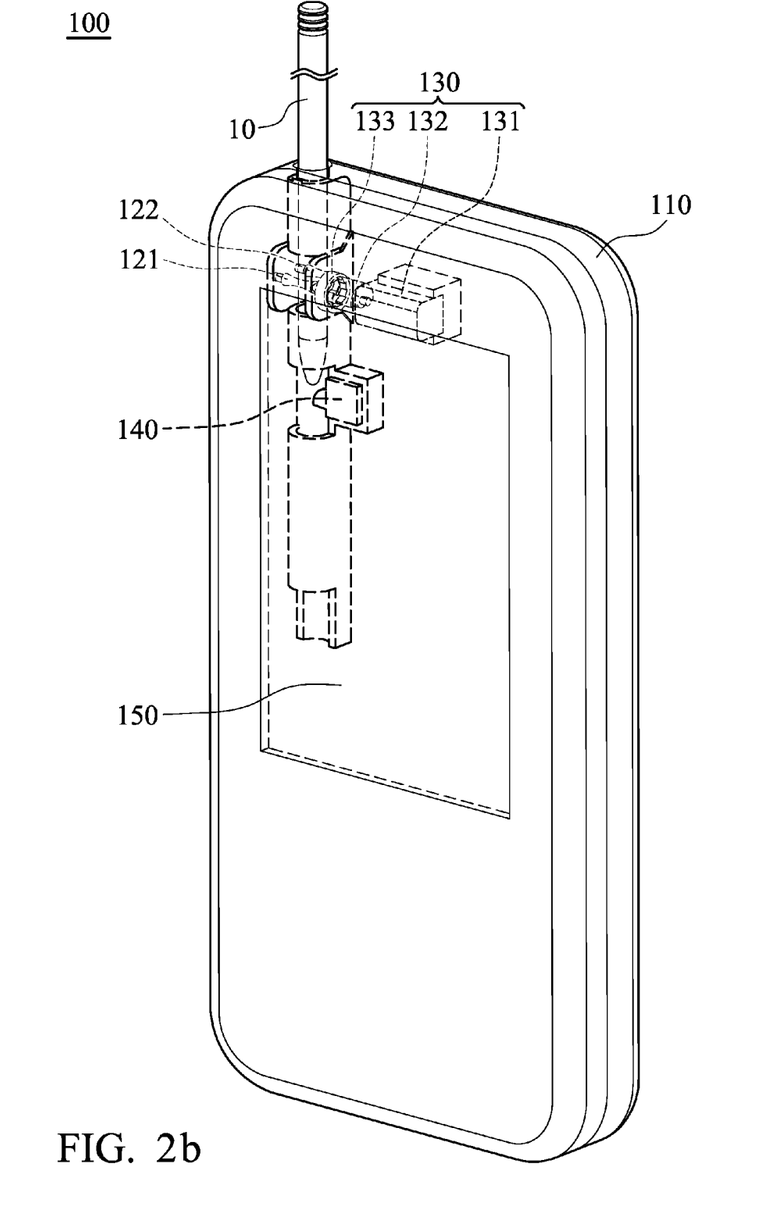
FIG. 2b shows the electronic device of the embodiment of the invention, wherein the peripheral element is in a second position.

FIG. 2a shows an electronic device 100 (mobile phone or Personal Digital Assistant) of an embodiment of the invention, which is capable of ejecting a peripheral element (stylus pen) 10. In the embodiment, a vibration alert driving motor provides kinetic energy to push the peripheral element (stylus pen) 10. The electronic device 100 comprises a housing 110, an active wheel (first wheel) 121, a passive wheel (second wheel) 122 and a driving unit 130. The peripheral element 10 is stored in the housing 110. The active wheel 121 is disposed in the housing 110 and contacts the peripheral element 10. The active wheel 121 and the passive wheel 122 hold and position the peripheral element 10. The driving unit 130 is disposed in the housing 110. When a user needs to unload the peripheral element 10 from the housing 110, the driving unit 130 rotates the active wheel 121, the active wheel 121 moves the peripheral element 10 from a first position (as shown in FIG. 2a) to a second position (as shown in FIG. 2b), and the peripheral element 10 is partially exposed out of the housing 110.

The driving unit 130 comprises a driving motor 131, an eccentric element 132 and a clutch 133. The driving motor 131 is connected to the eccentric element 132. The eccentric element 132 is connected to the clutch 133. The clutch 133 is connected to the active wheel 121. When the driving motor 131 rotates the eccentric element 132 in a first direction, the clutch 133 transmits kinetic energy from the eccentric element 132 to the active wheel 121. When the driving motor 131 rotates the eccentric element 132 in a second direction, the clutch 133 stops the kinetic energy from being transmitted to the active wheel 121.

Figure 3A:
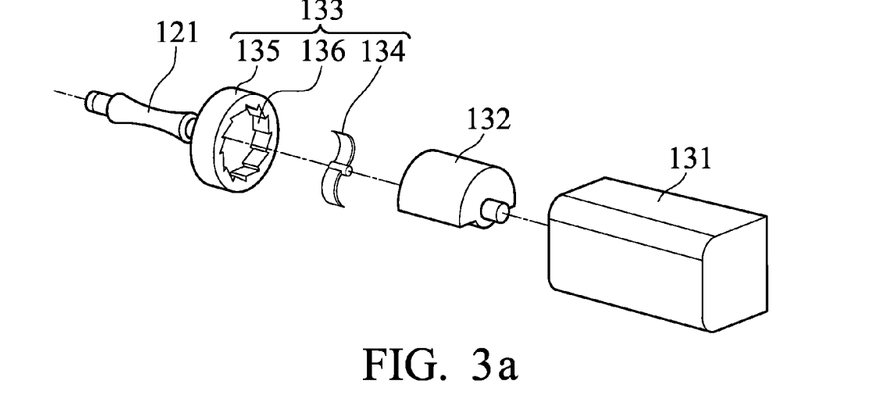
FIG. 3a is an exploded view of a clutch of the embodiment of the invention.
Figure 3B:
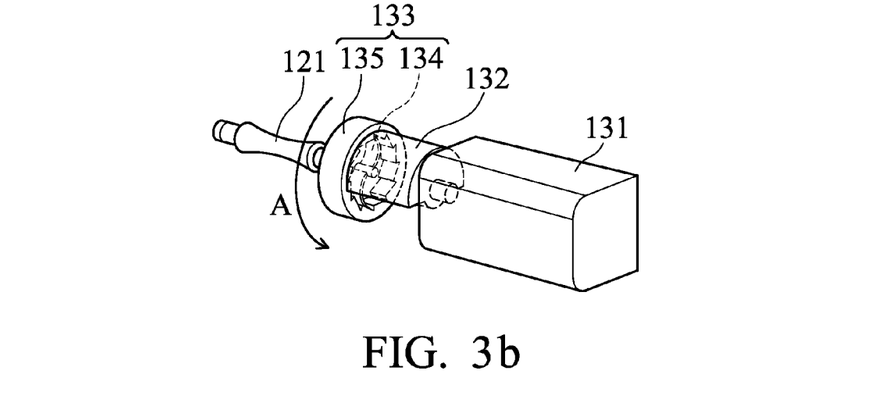
FIG. 3b shows a driving motor rotating in a first direction.
Figure 3C:
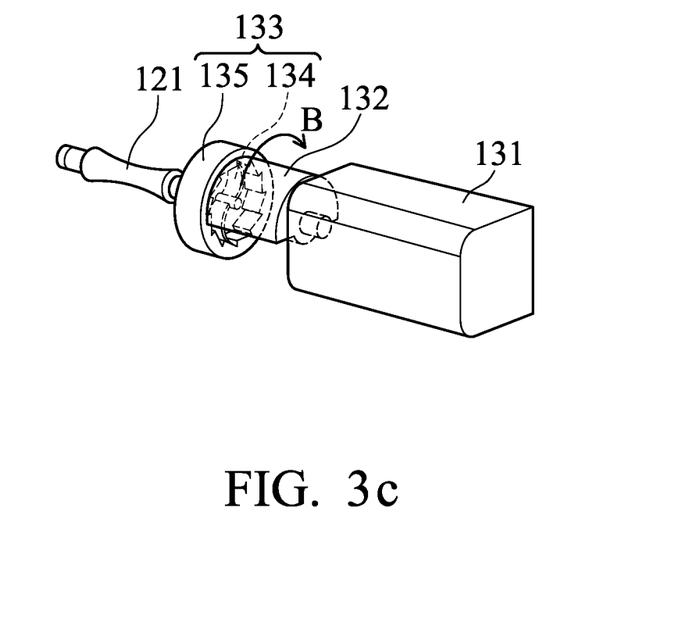
FIG. 3c shows the driving motor rotating in a second direction.

With reference to FIG. 3a, the clutch 133 comprises a ring 135 and a blade element 134. The ring 135 connected to the active wheel 121 and having at least one tooth 136 on the inner surface of the ring 135. The blade element 134 is connected to the driving unit 130. With reference to FIG. 3b, when the driving motor 131 rotates in the first direction A, the blade element 134 drives the ring 135 to rotate by engaging with the ring 135 via the tooth 136. With reference to FIG. 3c, when the driving motor 131 rotates in the second direction B, the blade element 134 idle rotates in the ring 135, and the kinetic energy is stopped from being transmitted to the active wheel 121 to prevent the active wheel 121 from being driven to rotate by the driving motor 131.

When the driving motor 131 rotates the eccentric element 132 in the first direction A, the driving motor 131 rotates the eccentric element 132 at a first rotational speed. When the driving motor 131 rotates the eccentric element 132 in the second direction B, the driving motor 131 rotates the eccentric element 132 at a second rotational speed. The second rotational speed is greater than the first rotational speed. In this embodiment, the first rotational speed is about 300 rpm, and the second rotational speed is about 10000 rpm. Therefore, when the peripheral element is unloaded, the driving motor 131 rotates at the first rotational speed (low speed), and the electronic device 100 moves the peripheral element 10 out of the housing stably and slowly. When the electronic device 100 receives a phone call or actives a time alarm, the driving motor 131 rotates at the second rotational speed (high speed) to provide vibration alert.

With reference to FIGS. 2a and 2b, the electronic device 100 further comprises a sensor 140. The sensor 140 is disposed in the housing 110 to sense the position of the peripheral element 10.

Figure 4:
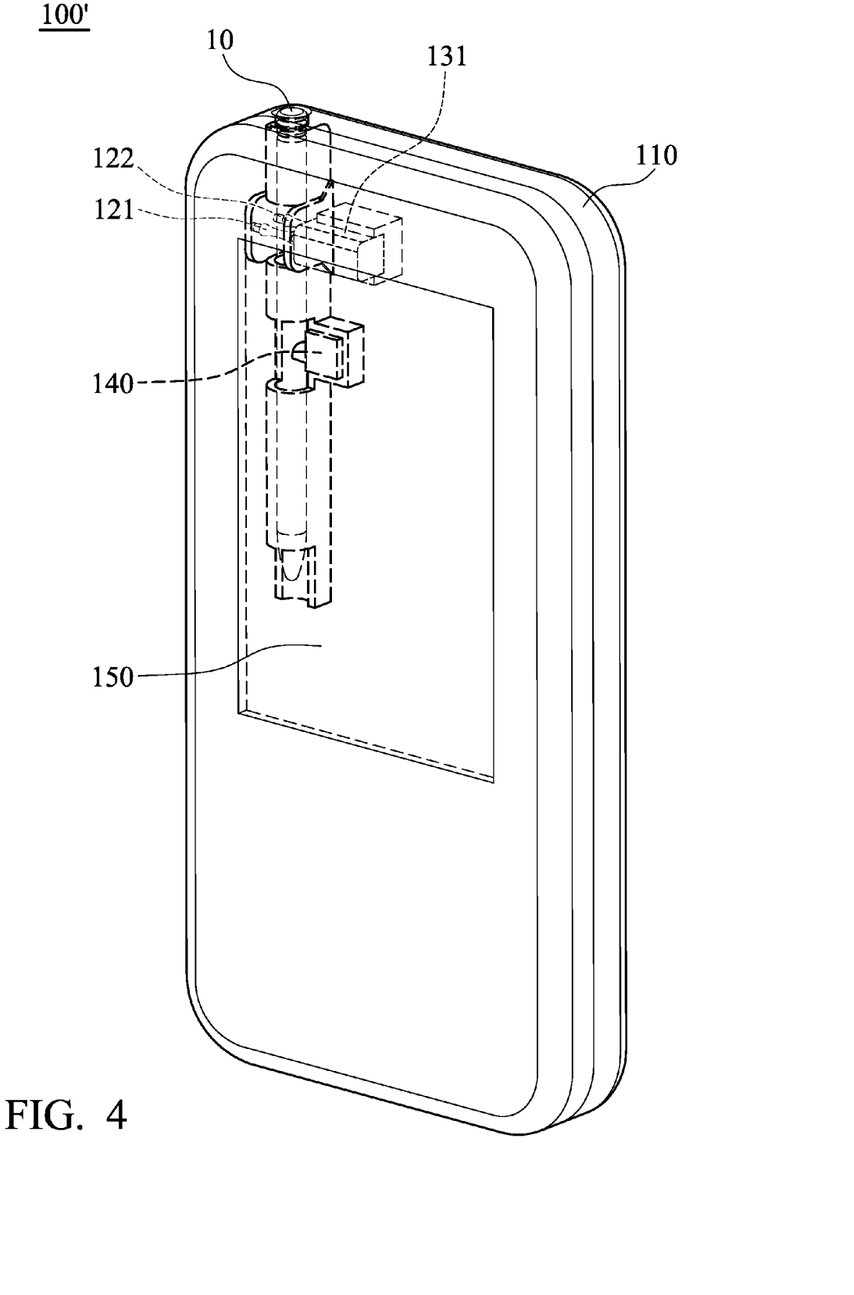
FIG. 4 shows an electronic element of another embodiment of the invention.

FIG. 4 shows an electronic element 100' of another embodiment of the invention, wherein the driving motor 131 is directly connected to the active wheel 121. In this embodiment, the driving motor 131 only provides the function of moving the peripheral element 10.

Figure 5:
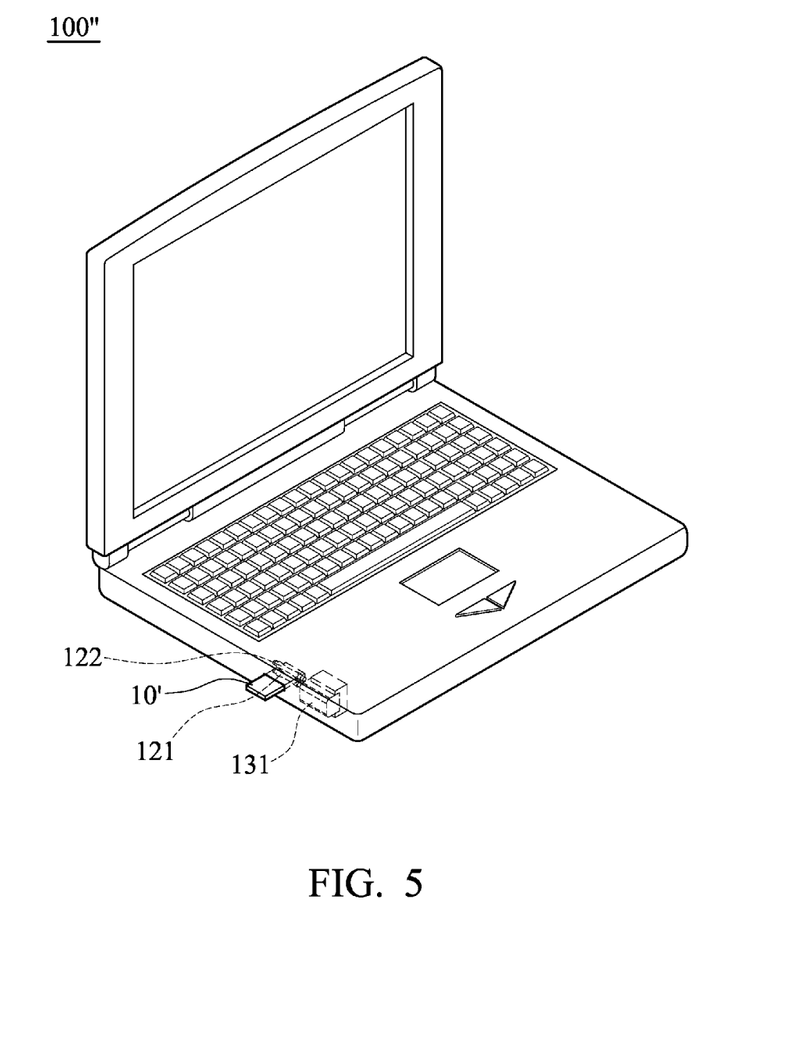
FIG. 5 shows an electronic device (notebook) of another embodiment of the invention.

FIG. 5 shows an electronic device 100" (notebook) of another embodiment of the invention, wherein the driving motor 131 is directly connected to the active wheel 121 to move the peripheral element (electronic card) 10'.

Figure 6:
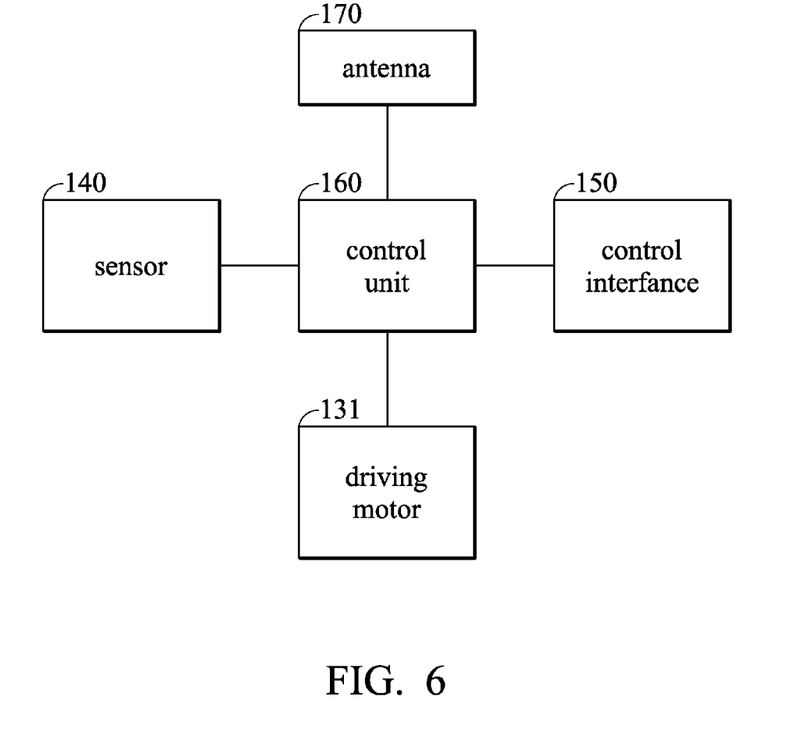
FIG. 6 shows the system of the electronic device of the embodiment of the invention.

With reference to FIGS. 2a and 6, the electronic device 100 further comprises a control interface 150, a control unit 160 and an antenna 170. The control unit 160 is electrically connected to the driving motor 131, the sensor 140, the control interface 150 and the antenna 170. The control unit 160 controls the driving unit with program.

Figure 6A:
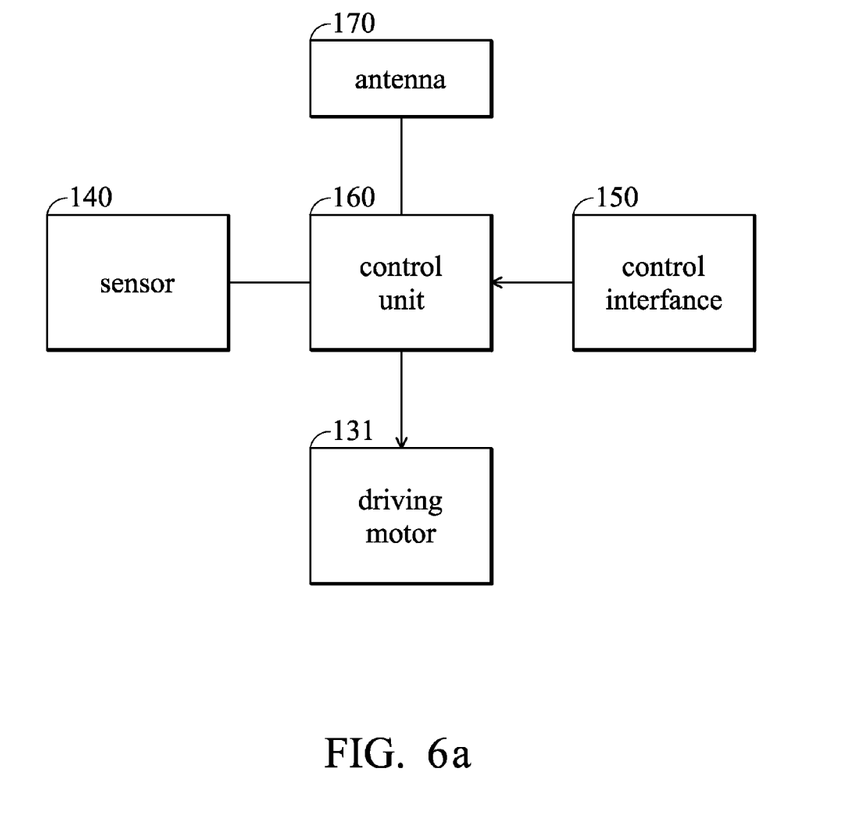
FIG. 6a shows a control unit receiving a writing module command.

With reference to FIG. 6a, when a user inputs a writing module command to the control unit 160 via the control interface 150, the control unit 160 rotates the driving motor 131 in the first direction according to the writing module command to rotate the active wheel, and the peripheral element is moved from the first position to the second position to be partially exposed out of the housing.

Figure 6B:
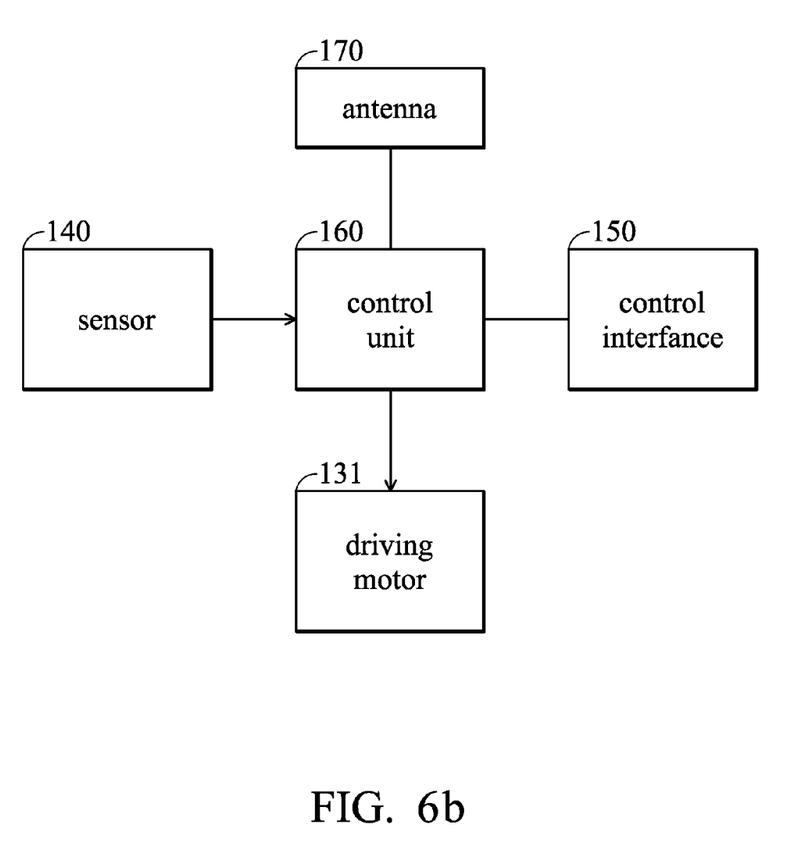
FIG. 6b shows a control unit receiving a position signal.

With reference to FIGS. 2b and 6b, when the peripheral element is moved to the second position, the sensor 140 transmits a position signal to the control unit 160, and the control unit 160 stops the driving motor 131 according to the position signal.

Figure 6C:
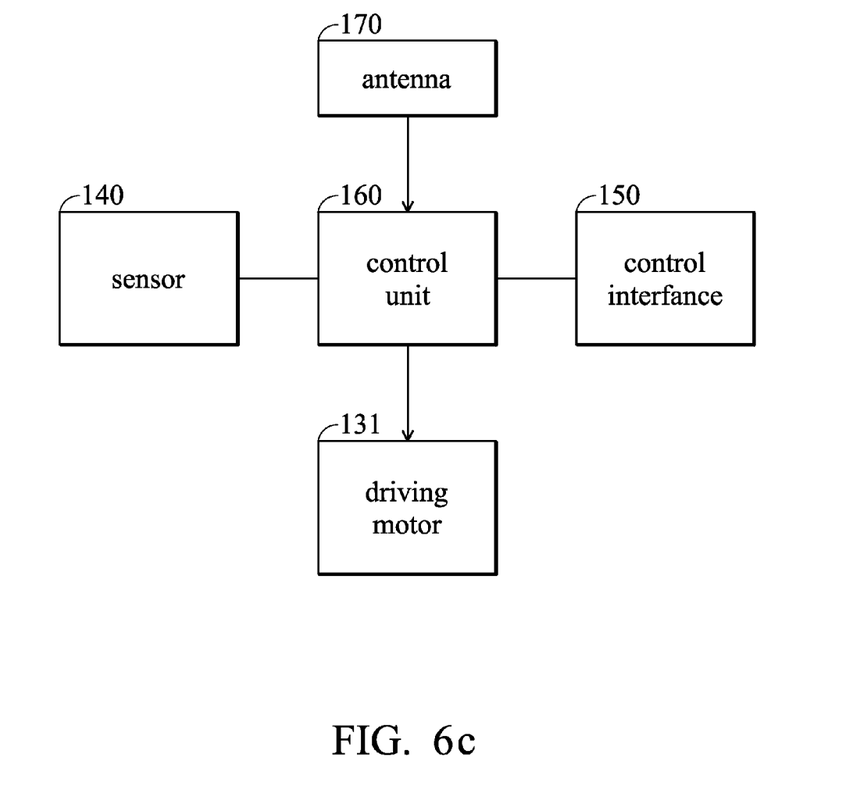
FIG. 6c shows a control unit receiving a wireless signal.

With reference to FIG. 6c, when the antenna 170 receives a wireless signal, the control unit 160 controls the driving motor 131 to rotate in the second direction according to the wireless signal to provide vibration alert.

In one embodiment, the invention provides a method for automatically ejecting a peripheral element from an electronic device. The method includes the following steps. First, an operation state of the electronic device is sensed. Then, a control signal is transmitted to a driving unit according to the operation state. Finally, the driving unit unloads the peripheral element from the electronic device according to the control signal, wherein the control signal comprises a stylization control command for determining the operation state and a movement of the driving unit.

When the operation state is performing an application program, the driving unit unloads the peripheral element from the electronic device according to the control signal. Or, when the operation state is stopping an application program, the driving unit unloads the peripheral element from the electronic device according to the control signal.

The electronic device of the embodiment of the invention unloads the peripheral element automatically. Thus, the embodiment of the invention provides convenience to users, and has increased value.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device capable of ejecting a peripheral element, comprising:
    a housing, having a chamber for storing the peripheral element;
    a first wheel disposed in the housing, wherein the first wheel contacts the peripheral element when the peripheral element is stored in the chamber;
    a driving motor; and
    a clutch, connected to the driving motor and the first wheel, wherein when the driving motor rotates in a first direction, the clutch rotates the first wheel so as to move the peripheral element from a first position to a second position, and when the driving motor rotates in a second direction, the clutch prevents the first wheel from being driven to rotate by the driving motor.

2. The electronic device as claimed in claim 1, further comprising a second wheel, wherein the first wheel and the second wheel limit the position of the peripheral element when the peripheral element is in the housing.

3. The electronic device as claimed in claim 1, wherein the clutch comprises:
    a ring connected to the first wheel and having at least one tooth on the inner surface of the ring; and
    a blade connected to the driving motor, wherein when the driving motor rotates in the first direction, the blade element drives the ring to rotate by engaging with the ring via the tooth.

4. The electronic device as claimed in claim 1, further comprising an eccentric element, wherein the driving motor is connected to the eccentric element, and the eccentric element is connected to the clutch.

5. The electronic device as claimed in claim 4, wherein when the driving motor rotates in the first direction, the driving motor rotates the eccentric element at a first rotational speed, and when the driving motor rotates in the second direction, the driving motor rotates the eccentric element at a second rotational speed.

6. The electronic device as claimed in claim 5, whereat the first rotational speed is about 300 rrpm, and the second rotational speed is about 10000 rpm.

7. The electronic device as claimed in claim 6, further comprising a sensor, wherein the sensor is disposed in the housing to sense a position of the peripheral element.

8. The electronic device as claimed in claim 1, further comprising a control unit, wherein the control unit controls the driving motor.

9. The electronic device as claimed in claim 8, wherein the control unit controls the driving motor with a program.

10. An electronic device, comprising:
    a stylus pen;
    a housing, having a chamber for storing the stylus pen;
    a first wheel, disposed in the housing, wherein the first wheel contacts the stylus pen when the stylus pen is stored in the chamber;
    a driving motor; and
    a clutch, connected to the driving motor and the first wheel, wherein when the driving motor rotates in a first direction, the clutch rotates the first wheel so as to move the stylus pen from a first position to a second position, and when the driving motor rotates in a second direction, the clutch prevents the first wheel from being driven to rotate by the driving motor.

11. The electronic device as claimed in claim 10, further comprising a second wheel, wherein the first wheel and the second wheel hold and position the stylus pen.

12. The electronic device as claimed in claim 10, further comprises an eccentric element, wherein the driving motor is connected to the eccentric element, and the eccentric element is connected to the clutch.

13. The electronic device as claimed in claim 12, wherein the clutch comprises:
   a ring connected to the first wheel and having at least one tooth on the inner surface of the ring; and
   a blade connected to the driving motor, wherein when the driving motor rotates in the first direction, the blade element drives the ring to rotate by engaging with the ring via the tooth.

14. The electronic device as claimed in claim 12, wherein when the driving motor rotates in the first direction, the driving motor rotates the eccentric element at a first rotational speed, and when the driving motor rotates in the second direction, the driving motor rotates the eccentric element at a second rotational speed.

15. The electronic device as claimed in claim 14, wherein the first rotational speed is about 300 rrpm, and the second rotational speed is about 10000 rpm.

16. The electronic device as claimed in claim 10, further comprising a sensor, wherein the sensor is disposed in the housing to sense a position of the stylus pen.

17. The electronic device as claimed in claim 10, further comprising a control unit, wherein the control unit controls the driving motor.

18. The electronic device as claimed in claim 17, wherein the control unit controls the driving motor with a program.

* * * * *